(12) United States Patent
Hunt et al.

(10) Patent No.: US 6,428,387 B1
(45) Date of Patent: Aug. 6, 2002

(54) METHOD FOR CHEMICAL MECHANICAL POLISHING USING A HIGH SELECTIVE SLURRY

(75) Inventors: Kyle P. Hunt; William R. Morrison, both of Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 79 days.

(21) Appl. No.: 09/615,378

(22) Filed: Jul. 13, 2000

Related U.S. Application Data

(60) Provisional application No. 60/147,065, filed on Aug. 4, 1999.

(51) Int. Cl.[7] ............................ B24B 1/00; B24B 49/00; B24B 51/00
(52) U.S. Cl. ................................ 451/8; 451/36; 451/41
(58) Field of Search .......................... 451/8, 9, 36, 41, 451/59, 60, 63; 216/88, 89; 438/690–693

(56) References Cited

U.S. PATENT DOCUMENTS

| | | | | |
|---|---|---|---|---|
| 5,938,505 A | * | 8/1999 | Morrison et al. | 451/36 |
| 6,140,245 A | * | 10/2000 | Lee | 438/705 |
| 6,179,688 B1 | * | 1/2001 | Beckage et al. | 451/6 |

* cited by examiner

*Primary Examiner*—Timothy V. Eley
(74) *Attorney, Agent, or Firm*—Peter K. McLarty; W. James Brady, III; Frederick J. Telecky, Jr.

(57) ABSTRACT

A chemical mechanical polishing method using a modified slurry. A modified slurry is used with high platen rotational speed and high wafer carrier rotation speeds. The endpoint of the polishing process is determined by monitoring the electrical current of the wafer carrier motor.

12 Claims, 1 Drawing Sheet

METHOD FOR CHEMICAL MECHANICAL POLISHING USING A HIGH SELECTIVE SLURRY

This application claims the benefit of provisional application No. 60/147,065 filed Aug. 4, 1999.

CROSS-REFERENCE TO RELATED PATENT/PATENT APPLICATIONS

The following commonly assigned patent/patent applications are hereby incorporated herein by reference:

| Patent No./Ser. No. | Filing Date | TI Case No. |
| --- | --- | --- |
| 09/034,514 | 03/04/98 | TI-23590AA |

FIELD OF THE INVENTION

The present invention relates to an chemical mechanical polishing method using a high selective slurry. Specifically, the invention involves using a modified slurry formed by mixing a polishing slurry with a salt of tetramethyl ammonium and hydrogen peroxide with a chemical mechanical polishing method.

BACKGROUND OF THE INVENTION

Various isolation structures are presently used for fabricating semiconductor devices. For example, shallow isolation structures are used in order to isolate adjacent electronic devices (such as transistors) which are formed in fabricating certain semiconductor circuits. Typically, such shallow isolation structures are created using the well-known LOCal Oxidation of Silicon (LOCOS) isolation technique. In the LOCOS process, a pad-oxide ($SiO_2$) layer is first grown on the surface of a semiconductor substrate with a silicon nitride ($Si_3N_4$) layer being deposited over the pad-oxide layer. Using well-known photolithography methods, these layers are then patterned to define the width of the shallow recess to be etched in the substrate. Once the shallow recess has been etched, the substrate is subjected to an oxidation process where silicon dioxide ($SiO_2$) is grown in the recess; the silicon nitride layer which has not yet been removed prevents any oxide growth over the surface of the substrate. As a result, oxide grows to fill the entire recess including the opening in the patterned oxide and silicon nitride layers which defined the width of the shallow recess. The disadvantages to this process is that the silicon dioxide formed in the recessed opening is grown in an isotropic manner, which consumes surface area on the semiconductor circuit. This causes the adjacent electronic devices that are being separated to be a fixed minimum distance apart.

Another technique used to create transistor isolation structures is by using a trench formed in the substrate. This method is known as Shallow Trench Isolation (STI). In the STI process, a pad-oxide ($SiO_2$) layer is grown on the semiconductor substrate and a silicon nitride ($Si_3N_4$) layer formed on the pad-oxide layer. Using well known methods the $Si_3N_4$ layer is patterned and etched to define the widths of the isolation structures. The semiconductor substrate is etched to form trenches and silicon oxide is used to fill the trenches and cover the semiconductor surface. Using well known methods, the silicon oxide is patterned and etched before using chemical mechanical polishing (CMP) to remove the silicon oxide covering the silicon nitride layer. The patterning and etching of the silicon oxide before CMP is necessary to reduce dishing of the silicon oxide film in the trenches. Following the removal of the silicon oxide layer, the silicon nitride layer is removed and electronic devices can be fabricated on the semiconductor substrate.

The major disadvantage of the above described STI methodology is the pattern and etch process steps required before removal of the silicon oxide using CMP. The silicon oxide layer is patterned using potolithography which adds cost to the process. In addition, portions of the silicon oxide film remaining after the pattern and etch processes can break off during CMP scratching the semiconductor surface.

The removal of the silicon oxide layer using CMP is accomplished through the use of an abrasive slurry. In general, the CMP process is accomplished by bringing a wafer mounted on a rotating carrier into contact with a rotating polishing pad upon which the slurry is delivered. CMP is a combination of mechanical polishing and the chemical action of the slurry. In general, the slurry used in this process has a selectivity of <5:1, silicon oxide polish rate to silicon nitride polish rate. It is this low slurry selectivity that necessitates the patterning and etching of the silicon oxide layer before polishing.

Various methods have been tried to reduce the dishing problem. Boyd and Ellul (J. M. Boyd, et al., Electochem. Soc. Proc., Vol. 95-5, 1996, p. 290) reported the use of a thin nitride over coat deposited on top of the gap filled oxide to reduce dishing. The nitride overcoat provides protection to the underlying oxide in low lying regions while the high level oxide is being polished at a much faster rate due to the oxide:nitride selectivity of 4:1.

SUMMARY OF INVENTION

The instant invention is a CMP method using a high selective slurry. The method comprises: delivering a modified slurry to a surface of a polishing pad, said pad being affixed to a rotating platen, wherein said modified slurry consists of combining a slurry with salt of tetramethyl ammonium and hydrogen peroxide; attaching a semiconductor wafer with a downwardly facing surface to a rotating wafer carrier; and bringing said downwardly facing semiconductor wafer surface into contact with said surface of said polishing pad.

Advantages of the instant invention include high planarization rates with wafer range capability of less than 500A, point of use mixing of high pH chemicals, and accurate end point determination. Other technical advantages will be readily apparent to one skilled in the art from the following FIGUREs, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
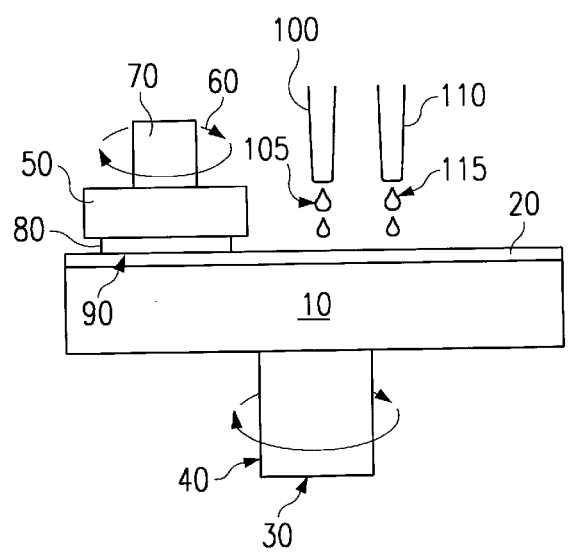
FIG. 1 is an schematic diagram of a CMP polishing apparatus.

STI CMP processing without the reverse patterning and etch processes requires a high polish removal for optimal STI structures to be fabricated on the semiconductor surface. As used herein, the phrase "polish removal selectivity" refers to the ratio of removal of silicon dioxide ($SiO_2$) to silicon nitride ($Si_3N_4$) as measured on sheet film wafers. In prior art techniques, the polish removal selectivity is most commonly 4:1. By using the techniques described herein, "enhanced polish removal selectivity" refers to a polish selectivity of 10:1 or greater. The technique involves modification of basic slurry compositions to achieve the enhanced polish removal.

In a preferred embodiment of the instant invention, tetramethylammonium hydroxide (TMAH) and hydrogen peroxide are added to a slurry to improve the polish selectivity. Namely a slurry with an enhanced polish removal selectivity of 30:1 has been achieved. In an alternative embodiment, different salts of tetramethylammonium (TMA) and a highly basic solution are added to the slurry to enhance polish removal selectivity. A slurry using this method has shown an enhanced polish removal selectivity of greater than 10:1.

A suitable slurry is a colloidal silicia formulation having an initial pH of around 10.5. Suitable slurries include, but are not limited to, Cabot (El Dorado Hills, Calif. USA) SC112 or Rodel (Newark, Del.)ILD 1300. These slurries represent the mainstream slurries used in oxide polish operations by most major US semiconductor manufacturers. In the preferred embodiment of the present invention, the slurry is SC112 from Cabot.

When the correct amount of tetramethylammonium hydroxide (TMAH) alone is used (without $H_2O_2$), the pH may become greater than 13, causing the silica or other suspended particles to become non-colloidal (charge loss) and fall out of suspension. Thus, the colloidal nature of the slurry is lost and the slurry performance is adversely affected. The hydrogen peroxide is introduced to lower the pH to less than 13, thereby preventing the silica dissolution from the slurry. It is preferable that the final pH of the slurry (after addition of the TMAH and H202) be in the range of 11.0 to 13, and most preferably in the range of 11.5 to 12.0. It is also preferable that the slurry to TMAH ratio (volume:volume) is between 50:1 to 55:1, or between 50 and 55 parts slurry to 1 part TMAH. The ratio of slurry to $H_2O_2$ is preferably between 300:1 to 500:1 (volume:volume). For all mixtures described herein, the TMAH has a 25% concentration (2.7 moles/L) and the hydrogen peroxide used has a 30% concentration (9.8 moles/L). With this modified slurry formulation, an enhanced polish removal selectivity of greater than 15:1 oxide to nitride is achieved. In fact, enhanced polish removal selectivity ratios of 30:1 may be obtained.

TMAH is known to have stability problems because of its degradation into trimethyl amines. This breakdown causes performance of the slurry to degrade over time. Hence, it is preferable that the modified slurry be used soon after it is prepared. The modified slurry should be used within two hours after preparation, as polish removal selectivity of the modified slurry diminishes to below 5:1 after three hours.

Useful salts of TMA include, but are not limited to chloride, bromide, iodide, sulfide, or fluoride salts. Most preferably, the TMA salt is tetramethylammonium fluoride added to increase the pH to 11 to 13, and most preferably to 11.6 to 11.9. The correct pH is maintained by a basic solution such as, but not limited to potassium hydroxide.

This modified slurry provides a selectivity of 10:1 or greater.

Illustrated in FIG. 1 is a schematic diagram of a CMP system for use with the above described high selective slurries. The system comprises a table (platen) 10 that rotates around the axis 30 in the direction shown 40. In an embodiment of the instant invention, the platen 10 rotation is in a counter clockwise direction. A polishing pad 20 is affixed to the platen and is used to polish the surface of the semiconductor wafer 90. In some instances the polishing pad 20 will be formed using polyurethane or other similar materials. The semiconductor wafer 80 is attached face down to a wafer carrier 50 that rotates around an axis 70. The wafer carrier 50 rotates in the same direction as the platen 10. The high selective slurry used in the polishing process is mixed at the point of use using separate delivery systems. The first system 100 is used to supply a mainstream slurry such as SC112 described above. The second system 110 supplies the TMAH/hydrogen peroxide additive or additives using TMA fluoride salts/KOH and hydrogen peroxide that are used to form the high selective slurry. In another embodiment of the instant invention, the chemicals can be combined above the surface of the table by mixing the slurry and the additives before delivery to the platen surface or polishing pad 20. The centrifugal force on the slurry due to the platen rotation causes mixing of the chemicals and their delivery to the wafer surface 90. During the polishing process, the wafer carrier periodically lifts the wafer off the surface of the platen (and polishing pad) to allowing mixing of the chemicals (interpolish lift off). For a STI silicon oxide removal/planarization process this occurs about every 30 seconds for about 3 seconds. The frequency and duration of this interpolish lift off process is not confined to these times but will be a function of the process where CMP of different materials will require different times or frequencies. With the use of high selective slurries, the platen rotational speed and the carrier rotational speed will have a significant effect on the silicon oxide to silicon nitride removal rate ratio. As the platen speed of rotation increases, the oxide removal rate increases. For the high selective slurries described above, platen rotational speeds of between 80(RPM) and 110(RPM) and wafer carrier rotational speeds of between 40(RPM) and 80(RPM) have been found to optimum. The downward force applied by the wafer carrier 50 in contacting the wafer surface 90 to the polishing pad 20 (back pressure) also has a significant effect on the process. For the method of the instant invention using the above described high selective slurry, a back pressure of between 3.5 (PSI) and 5.5 (PSI) has been found to be optimum.

Figure 2A:
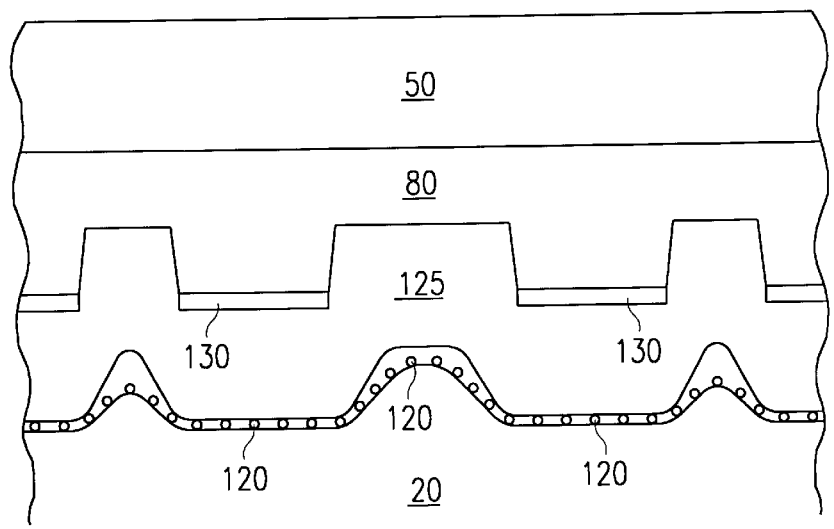
FIG. 2A is a cross-section diagram of the wafer surface topography, polishing pad, slurry, and the wafer carrier.
Figure 2B:
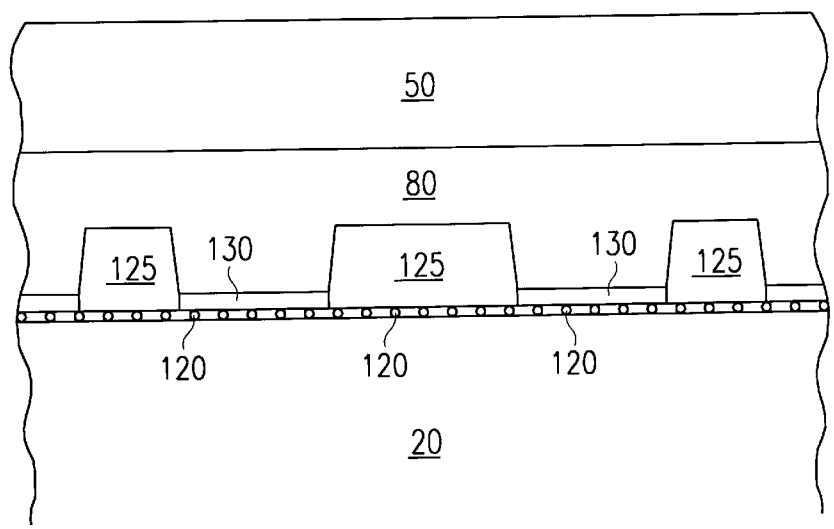
FIG. 2B is a cross-section diagram showing the end of the CMP process.

Shown in FIG. 2A is a cross section of the wafer carrier 50, the wafer 80 and the polishing pad 20. The wafer is affixed to the wafer carrier with the wafer surface to be polished facing the polishing pad 20. For the STI process, a silicon oxide layer 125 is in contact with the polishing pad. The slurry 120 will be in contact with the silicon oxide layer 125 and the polishing pad 20. The use of a high selective slurry negates the need for the patterning and etching of the silicon oxide 125 before CMP, and the layer 125 can be polished after formation. As stated above during the polishing process both the polishing pad 20 and the wafer carrier 50 will rotate in the same direction. This rotation produces friction between the wafer 80 and the pad 20 which aids the polishing process. The polishing process ends when the silicon oxide above the silicon nitride 130 has been removed and a planar wafer surface exists as shown in FIG. 2B.

A critical factor in any CMP process is determining hen surface planarization has occurred. In the STI CMP process gross surface non-uniformities such as oxide dishing can occur without a proper end point determination. Using the above described high selective slurry and CMP apparatus, the instant invention results in a surface topography polish rate about 75%–100% higher than previous CMP methods but polishes planar surfaces at rates about 75% slower than previous CMP methods. This disparity in polishing rates can be used to determine the end point of the CMP process. During the CMP process, as the surface topography is reduced, the friction between the pad 20 and the wafer carrier 50 increases. The pad 20 rotates at a higher rate than the wafer carrier 50 and this increase in friction will cause the pad 20 to exert more force on the wafer carrier 50 trying to increase its rate of rotation. In order to maintain a constant rate of rotation, more current is supplied to the motor which rotates the wafer carrier 50 to oppose this force. This increase in wafer carrier motor current can be monitored and used to determine when the surface is planar (or the end point of the CMP process).

Although the instant invention has been described with respect to a STI process, it can be used for other semiconductor processes. Some of these processes include polysilicon metal-one dielectric (PMD) layer and intermetal dielectric (ILD) layer planarization.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A chemical mechanical polishing semiconductor processing method, comprising:

delivering a modified slurry to a surface of a polishing pad, said pad being affixed to a rotating platen, wherein said modified slurry comprises a slurry combined with salt of tetramethyl ammonium, a base, and hydrogen peroxide;

attaching a semiconductor wafer with a downwardly facing surface to a rotating wafer carrier;

bringing said downwardly facing semiconductor wafer surface into contact with said surface of said polishing pad; and repeatedly removing and reestablishing contact of said downwardly facing semiconductor wafer surface with said polishing pad.

2. The method of claim 1 wherein said rotating platen has a rotational rate of 80 revolutions per minute to 110 revolutions per minute.

3. The method of claim 1 wherein said rotating wafer carrier has a rotational rate of 40 revolutions per minute to 80 revolutions per minute.

4. The method of claim 1 wherein said downwardly facing wafer surface is brought into contact with said pad with a pressure of 3.5 PSI to 5.5 PSI.

5. The method of claim 1 further comprising determining a end point by monitoring a electrical current of a motor used to cause rotation of said rotating wafer carrier.

6. The method of claim 1 wherein said delivering of a modified slurry comprises:

delivering said slurry to said polishing pad surface; and delivering simultaneously with said slurry said salt of tetramethyl ammonium, a base, and hydrogen peroxide.

7. A chemical mechanical polishing semiconductor processing method, comprising:

forming a modified slurry by the process of combining a slurry with salt of tetramethyl ammonium, and hydrogen peroxide;

delivering said modified slurry to a surface of a polishing pad, said pad being affixed to a rotating platen;

attaching a semiconductor wafer with a downwardly facing surface to a rotating wafer carrier;

bringing said downwardly facing semiconductor wafer surface into contact with said surface of said polishing pad;

maintaining a rotational rate of said rotating platen at between 80 revolutions per minute to 110 revolutions per minute; and repeatedly removing and reestablishing contact of said downwardly facing semiconductor wafer surface with said polishing pad.

8. The method of claim 7 wherein said rotating wafer carrier has a rotational rate of 40 revolutions per minute to 80 revolutions per minute.

9. The method of claim 7 wherein said downwardly facing wafer surface is brought into contact with said pad with a pressure of 3.5 PSI to 5.5 PSI.

10. The method of claim 7 further comprising determining a end point by monitoring a electrical current of a motor used to cause rotation of said rotating wafer carrier.

11. A chemical mechanical polishing semiconductor processing method, comprising:

delivering a modified slurry to a surface of a polishing pad wherein said modified slurry consists of combining a slurry with salt of tetramethyl ammonium and hydrogen peroxide;

attaching a semiconductor wafer with a downwardly facing surface to a rotating wafer carrier which has a rotational rate of 40 revolutions per minute to 80 revolutions per minute;

bringing said downwardly facing semiconductor wafer surface into contact with said surface of said polishing pad with a pressure of 3.5 PSI to 5.5 PSI; and repeatedly removing and reestablishing contact of said downwardly facing semiconductor wafer surface with said polishing pad.

12. The method of claim 11 further comprising determining a end point by monitoring a electrical current of a motor used to cause rotation of said rotating wafer carrier.

* * * * *